United States Patent
Nguyen et al.

(10) Patent No.: US 11,616,444 B2
(45) Date of Patent: Mar. 28, 2023

(54) MULTI-PHASE VOLTAGE CONVERTER WITH INDIVIDUAL PHASE TEMPERATURE REPORTING

(71) Applicant: Monolithic Power Systems, Inc., San Jose, CA (US)

(72) Inventors: James Nguyen, San Jose, CA (US); Chiahsin Chang, Cupertina, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 101 days.

(21) Appl. No.: 17/398,247

(22) Filed: Aug. 10, 2021

(65) Prior Publication Data
US 2023/0048949 A1    Feb. 16, 2023

(51) Int. Cl.
| | | |
|---|---|---|
| *H02M 1/088* | (2006.01) | |
| *H02M 3/158* | (2006.01) | |
| *H02M 1/00* | (2006.01) | |
| *H02M 1/32* | (2007.01) | |
| *H03K 5/24* | (2006.01) | |

(52) U.S. Cl.
CPC ........ *H02M 3/1586* (2021.05); *H02M 1/0003* (2021.05); *H02M 1/0043* (2021.05); *H02M 1/088* (2013.01); *H02M 1/327* (2021.05); *H03K 5/24* (2013.01)

(58) Field of Classification Search
CPC .. H02M 3/1586; H02M 1/0043; H02M 1/327; H02M 1/0003; H02M 1/088; H03K 5/24
See application file for complete search history.

(56) References Cited

U.S. PATENT DOCUMENTS

| | | | |
|---|---|---|---|
| 9,184,651 B2 | 11/2015 | James | |
| 9,263,937 B2 | 2/2016 | James | |
| 9,780,640 B2 | 10/2017 | James | |
| 9,812,963 B1 | 11/2017 | James | |
| 10,840,795 B1 | 11/2020 | James | |
| 11,303,204 B1* | 4/2022 | Zhao | H02M 1/0043 |
| 11,545,903 B1* | 1/2023 | Li | H02M 3/33523 |

* cited by examiner

*Primary Examiner* — Adolf D Berhane
(74) *Attorney, Agent, or Firm* — Perkins Coie LLP

(57) ABSTRACT

A multi-phase voltage converter has a plurality of integrated circuits (ICs), and a controller. Each IC has a control pin to receive a control signal, a monitoring pin and a temperature sensing circuit, the controller has a monitoring pin connected to the monitoring pin of each of the plurality of ICs to receive a monitoring signal. The temperature sensing circuit is connected to or disconnected from the monitoring pin of the corresponding one of the plurality of ICs in response to the control signal and the monitoring signal.

20 Claims, 10 Drawing Sheets

MULTI-PHASE VOLTAGE CONVERTER WITH INDIVIDUAL PHASE TEMPERATURE REPORTING

TECHNICAL FIELD

The present invention generally refers to electrical circuits, and more particularly but not exclusively refers to multi-phase voltage converter with individual phase temperature reporting.

BACKGROUND

In power conversion applications, an interleaved multi-phase voltage converter is widely used in large power and large current condition since the interleaved multi-phase voltage converter may be able to provide a large output current with small current ripples, optimized thermal and power distributions.

Traditionally, the interleaved multi-phase voltage converter has a plurality of phases coupled in parallel and a controller. Each phase may provide a temperature information through a pin TMON, and the controller has a monitoring pin coupled to the monitoring pin TMON of each phase at the same time. Thus, the controller monitors a highest temperature among the plurality of phases of the interleaved multi-phase voltage converter. However, individual temperature can not be obtained from the traditional interleaved multi-phase voltage converter.

SUMMARY

Embodiments of the present invention are directed to a multi-phase voltage converter, comprising a plurality of integrated circuits (ICs), and a controller. Each of the plurality of ICs provides a phase of the multi-phase voltage converter. Each of the plurality of ICs comprises a control pin, a monitoring pin, and a temperature sensing circuit that is configured to sense an individual temperature of a corresponding one of the plurality of ICs. The controller comprises a plurality of control pins and a monitoring pin. Each of the plurality of control pins of the controller is coupled to the control pin of the corresponding one of the plurality of ICs to provide a control signal, and the monitoring pin of the controller is coupled to the monitoring pin of each of the plurality of ICs to receive a monitoring signal. The temperature sensing circuit is configured to be connected to or disconnected from the monitoring pin of the corresponding one of the plurality of ICs in response to the control signal and the monitoring signal.

Embodiments of the present invention are further directed to an integrated circuit (IC), comprising a first pin, a second pin, a third pin, a fourth pin, a temperature sensing circuit, a high-side switch and a low-side switch. The first pin is configured to receive a control signal, the second pin is coupled to a plurality of ICs that are connected together to provide a monitoring signal, the third pin is configured to receive an input voltage, and the fourth pin is configured as a reference ground. The temperature sensing circuit is configured to sense a temperature of the IC. The high-side switch has a first terminal and a second terminal, the first terminal of the high-side switch is coupled to the third pin to receive the input voltage. The low-side switch has a first terminal and a second terminal, the first terminal of the low-side switch is coupled to the second terminal of the high-side switch, and the second terminal of the low-side switch is coupled to the fourth pin. Wherein the high-side switch and the low side switch are turned ON and OFF respectively based on the control signal, and wherein the temperature sensing circuit is configured to be connected to or be disconnected from the second pin based on the monitoring signal and the control signal.

Embodiments of the present invention are further directed to a temperature reporting method. The temperature reporting method comprises receiving a control signal via a first pin of an integrated circuit (IC), sensing a temperature of the IC via a temperature sensing circuit, providing a monitoring signal via a second pin of the IC based on the temperature, receiving an input voltage via a third pin of the IC, turning a power switch ON and OFF to convert the input voltage to an output voltage based on the control signal, and connecting the temperature sensing circuit to or disconnecting the temperature sensing circuit from the second pin of the IC in response to the monitoring signal and the control signal.

Embodiments of the present invention are further directed to a controller for a multi-phase voltage converter, comprising: a plurality of control pins, a monitoring pin and a control loop. The plurality of control pins are configured to provide a plurality of control signals to a plurality of integrated circuits (ICs) respectively, each of the plurality of ICs provides a phase of the multi-phase voltage converter. The monitoring pin is connected to each of the plurality of ICs to receive a monitoring signal. The control loop is configured to provide the plurality of control signals based on an output voltage of the multi-phase voltage converter and the monitoring signal. Wherein when the controller is configured to acquire an individual temperature of a desired one of the plurality of ICs, and if a corresponding control signal provided to the desired one of the plurality of ICs transits to a first status, the controller is configured to provide a command through the monitoring pin to the plurality of ICs.

These and other features of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
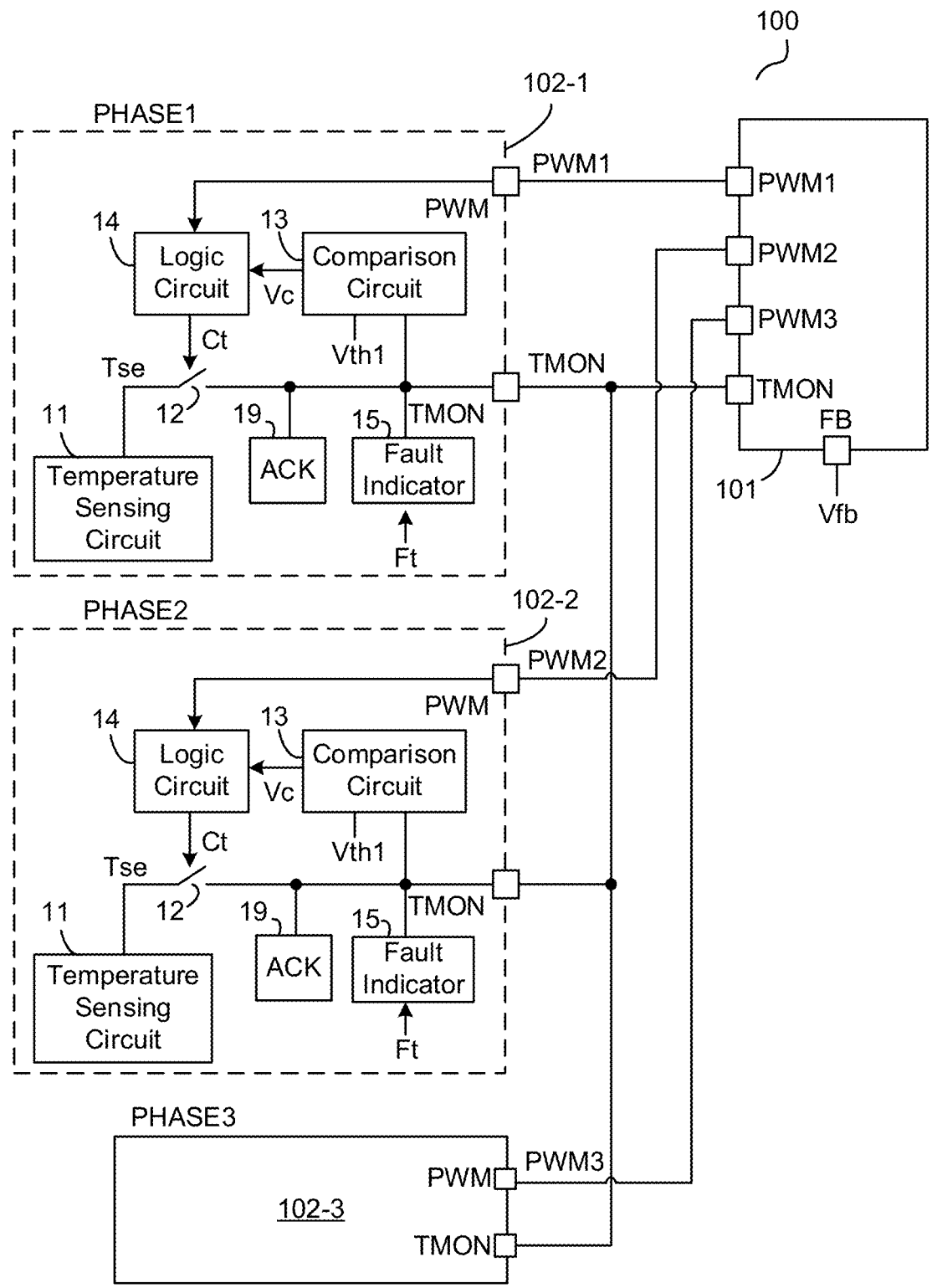
FIG. 1 schematically illustrates a multi-phase voltage converter diagram 100 in accordance with an embodiment of the present invention, FIG. 2 schematically illustrates the IC 102 of the multi-phase voltage converter 100 shown in FIG. 1 in accordance with an embodiment of the present invention.

FIG. 1 schematically illustrates a multi-phase voltage converter diagram 100 in accordance with an embodiment of the present invention. In the example of FIG. 1, the multi-phase voltage converter 100 comprises three integrated circuits (ICs) 102 (i.e., 102-1, 102-2, and 102-3), and a controller 101. As can be appreciated, the multi-phase voltage converter 100 may also be implemented with less or more ICs 102. In one example, each of the ICs 102 provides a phase of the multi-phase voltage converter.

As shown in FIG. 1, each IC 102 comprises a control pin PWM, a monitoring pin TMON, and the controller 101 comprises control pins PWM1, PWM2, PWM3 and a monitoring pin TMON. The control pin PWM1 of the controller 101 is coupled to the control pin PWM of the IC 102-1 to provide a control signal PWM1, the control pin PWM2 is of the controller 101 is coupled to the control pin PWM of the IC 102-2 to provide a control signal PWM2, and the control pin PWM3 of the controller 101 is coupled to the control pin PWM of the IC 102-3 to provide a control signal. The monitoring pin TMON of the controller 101 is coupled to the monitoring pin TMON of each the IC 102 to receive a monitoring signal TMON. In one example, when the controller 101 wants to acquire an individual temperature of a desired one of the ICs 102, and if a corresponding control signal PWM provided to the desired one of the ICs 102 transits to a first status (e.g., logic high), then the controller 101 is configured to provide a command CMD to force the monitoring signal TMON to be at a first condition. Forcing the monitoring signal TMON to be at the first condition may comprise but not limited to pulling up the monitoring signal TMON to be higher than a threshold Vth1 for a time period Tp2. For example, when the controller 101 is configured to acquire the individual temperature of the IC 102-1, the controller 101 is configured to provide the command CMD through the monitoring pin TMON immediately after a rising edge of the control signal PWM1, the command CMD forces the monitoring signal TMON to be pulled up to be higher than the threshold Vth1 for the time period Tp2. In another example, forcing the monitoring signal TMON to the first condition may also comprise pulling up the monitoring signal TMON to be higher than the threshold Vth1 for the time period Tp2 and then pulling down the monitoring signal TMON to low (e.g., 0V) for a time period Td3. For example, when the controller 101 is configured to acquire the individual temperature of the IC 102-1, the controller 101 is configured to provide a command CMD through the monitoring pin TMON immediately after a rising edge of the control signal PWM1, the command CMD forces the monitoring signal TMON to be pulled up to be higher than the threshold Vth1 for the time period Tp2, and then to be pulled down to 0V for the time period Td3. In one example, the controller 101 further has a feedback pin FB, to receive a feedback signal Vfb representative an output voltage Vo of the multi-phase voltage converter 100.

As shown in FIG. 1, each IC 102 further comprises a temperature sensing circuit 11 and a switch 12. The temperature sensing circuit 11 is configured to provide a temperature signal Tse representative of the individual temperature of the corresponding IC 102. The switch 12 is configured to connect the temperature sensing circuit 11 to the monitoring pin TMON of the corresponding IC 102 when the switch 12 is turned ON. The control pin PWM of the corresponding IC 102 is coupled to the controller 101 to receive the corresponding control signal PWM, i.e., the control pin PWM of the IC 102-1 is coupled to the controller 101 to receive the control signal PWM1, the control pin PWM of the IC 102-2 is coupled to the controller 101 to receive the control signal PWM2, and the control pin PWM of the IC 102-3 is coupled to the controller 101 to receive the control signal PWM3. In one example, when the monitoring signal TMON transits to be at the first condition, the temperature sensing circuit 11 is configured to be connected to or disconnected from the monitoring pin TMON of the corresponding IC 102 in response to the control signal PWM.

In one example, each IC 102 further comprises a comparison circuit 13 and a logic circuit 14. The comparison circuit 13 is coupled to the monitoring pin TMON of the corresponding IC 102 to receive the monitoring signal TMON, and the comparison circuit 13 is configured to provide a comparison signal Vc via comparing the monitoring signal TMON with the threshold Vth1. The threshold Vth1 is 2.5V as one example. The logic circuit 14 is coupled to the comparison circuit 13 to receive the comparison signal Vc and coupled to the control pin PWM of the corresponding IC 102 to receive the control signal PWM, and the logic circuit 14 is configured to provide a switching control signal Ct based on the control signal PWM and the comparison signal Vc to control the switch 12.

In one example, each IC 102 further comprises a fault indicator 15. The fault indicator 15 is configured to pull up the monitoring signal to the output terminal of the comparison circuit 13 to receive the comparison signal Vc, the data input terminal D is coupled to a one shot circuit 141 to receive the one shot pulse Pul, and the output terminal Q is configured to provide a logic signal Sta2 based on the comparison signal Vc and the control signal PWM to control the switch 12. In one example, the flip-flop 16 is configured to provide the logic signal Sta2 based on the control signal PWM at the rising edge of the comparison signal Vc. In one example, when the monitoring signal TMON becomes higher than the threshold Vth1, the comparison signal Vc becomes logic high, and if the one shot pulse Pul is at the first status, then the logic signal Sta2 becomes active to turn on the switch 12, the temperature signal Tsen is connected to the monitoring pin TMON via the switch 12.

Figure 2:
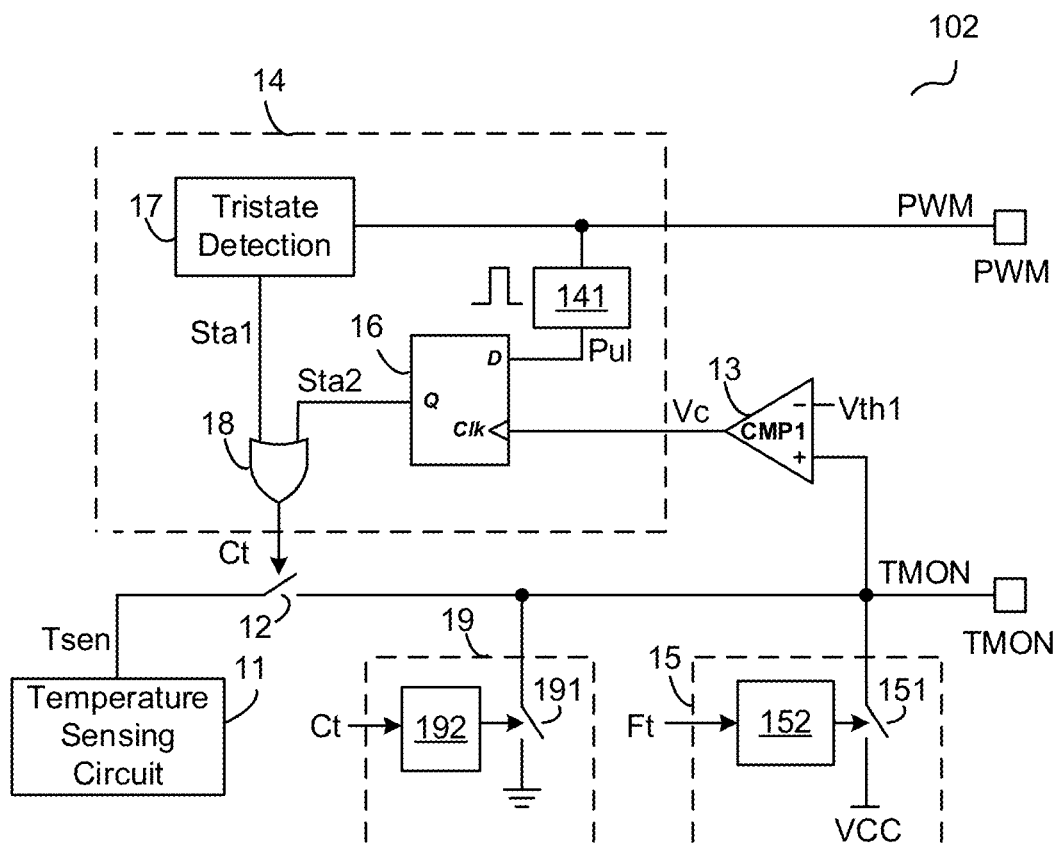

In the example of FIG. 2, the logic circuit 14 further comprises a tristate detection 17. The tristate detection 17 is configured to receive the control signal PWM, and is configured to provide a logic signal Sta1 based on the control signal PWM. In one example, when the control signal PWM is in a tristate region, (e.g., around a certain voltage level that is between the voltage source VCC and 0V), the logic signal Sta1 becomes active to turn on the switch 12, the temperature signal Tsen is then connected to the monitoring pin TMON via the switch 12 regardless voltage on the monitoring pin TMON.

In some examples, a voltage level between a high threshold voltage (e.g. 2V) and the voltage source VCC (e.g. 3.3V) is considered as logic high ("1"), a voltage level between zero voltage (0 V) and a low threshold voltage (e.g. 1V) is considered as logic low ("0"), and a voltage level between the high threshold voltage and low threshold voltage is considered as the tristate region.

In the example of FIG. 2, the logic circuit 14 further comprises a gate circuit 18. The gate circuit 18 is configured to receive a first logic signal Sta1 and a second logic signal Sta2, and is configured to provide a switching control signal Ct based on the logic signal Sta1 and the logic signal Sta2 to control the switch 12 ON and OFF. In one example, the gate circuit 18 comprises an OR gate.

In the example of FIG. 2, the fault indicator 15 further comprises a switch 151 and a driver 152. The switch 151 is configured to connect the monitoring pin TMON to the voltage source VCC when the switch 151 is turned ON. In one example, when the fault signal Ft indicates that the general fault occurs, the driver 152 is configured to turn ON the switch 151. In one example, the general fault may comprise but not limit to an over-current fault, a short fault, and/or an over-voltage fault.

In the example of FIG. 2, the acknowledgement circuit 19 comprises a switch 191 and a driver 192. The switch 191 has a first terminal coupled to the monitoring pin TMON, a second terminal coupled to a reference ground, and a control terminal coupled to the driver 192. The driver 192 receives the switching control signal Ct, and controls the switch 191. The switch 191 is configured to pull the monitoring pin TMON down to logic low after the switch 12 is turned ON.

Figure 3:
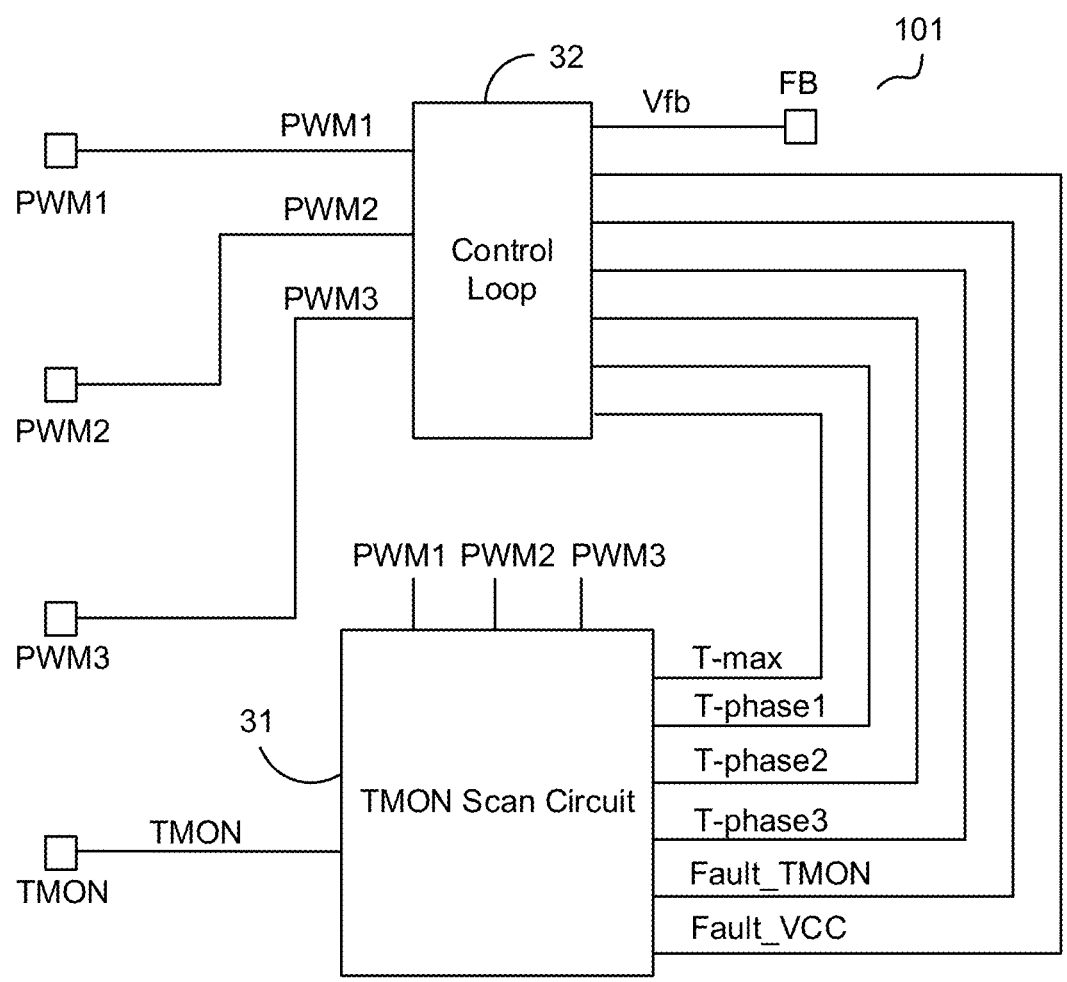
FIG. 3 schematically illustrates the controller 101 of the multi-phase voltage converter 100 shown in FIG. 1 in accordance with an embodiment of the present invention.

FIG. 3 schematically illustrates the controller 101 of the multi-phase voltage converter 100 shown in FIG. 1 in accordance with an embodiment of the present invention. FIG. 3 shows one example of the controller 101, one with ordinary skill in the art should understand that the detailed circuit structure of the controller 101 is not limited by the example shown in FIG. 3.

In the example of FIG. 3, the controller 101 comprises a TMON scan circuit 31 and a control loop 32. The TMON scan circuit 31 is configured to receive the monitoring signal TMON which represents a maximum temperature among the ICs 102 or the individual temperature of one of the ICs 102, the control signals PWM1-3. The TMON scan circuit 31 is configured to provide a maximum temperature signal T-max representative of the maximum temperature among the ICs 102, and a plurality of phase temperature signals (T-phase 1, T-phase 2, and T-phase 3) representative of the individual temperature of the IC 102-1, 102-2, and 102-3 respectively. In one example, after a time period Tp3 that the command CMD is provided to force the monitoring signal TMON to be at the first condition, the TMON scan circuit 31 is configured to sample the monitoring signal TMON and then record the sampled monitoring signal to a register as a corresponding one of the phase temperature signals T-phase 1, T-phase 2, and T-phase 3. In another example, when the ACK is received through the monitoring pin TMON of the controller 101, the TMON scan circuit 31 is configured to sample the monitoring signal TMON and then record the sampled monitoring signal to a register as a corresponding one of the phase temperature signals T-phase 1, T-phase 2, and T-phase 3.

In one example, the TMON scan circuit 31 is further configured to provide a temperature fault-indicating signal Fault_TMON based on the monitoring signal TMON to indicate that a temperature fault occurs on one of the IC 102. For example, when the monitoring signal TMON is higher than a threshold Vth2, the temperature fault-indicating signal Fault_TMON becomes active to indicate that the temperature fault occurs.

In one example, the TMON scan circuit 31 is further configured to provide a general fault-indicating signal Fault_VCC based on the monitoring signal TMON to indicate that a general fault occurs. For example, when the monitoring signal TMON is higher than a threshold Vth3, the general fault-indicating signal Fault_VCC becomes active to indicate that the general fault occurs.

The control loop 32 is configured to receive the feedback signal Vfb representative of the output voltage Vo, the maximum temperature signal T-max, and the phase temperature signals T-phase 1, T-phase 2, and T-phase 3, and is configured to provide the control signals PWM1-3 based on the output voltage Vo, the maximum temperature signal T-max, and the phase temperature signals T-phase 1, T-phase 2, and T-phase 3. In one example, the control loop 32 is further configured to provide the control signals PWM1-3 based on the temperature fault-indicating signal Fault_TMON. In one example, the control loop 32 is further configured to provide the control signals PWM1-3 based on the general fault-indicating signal Fault_VCC.

Figure 4A:
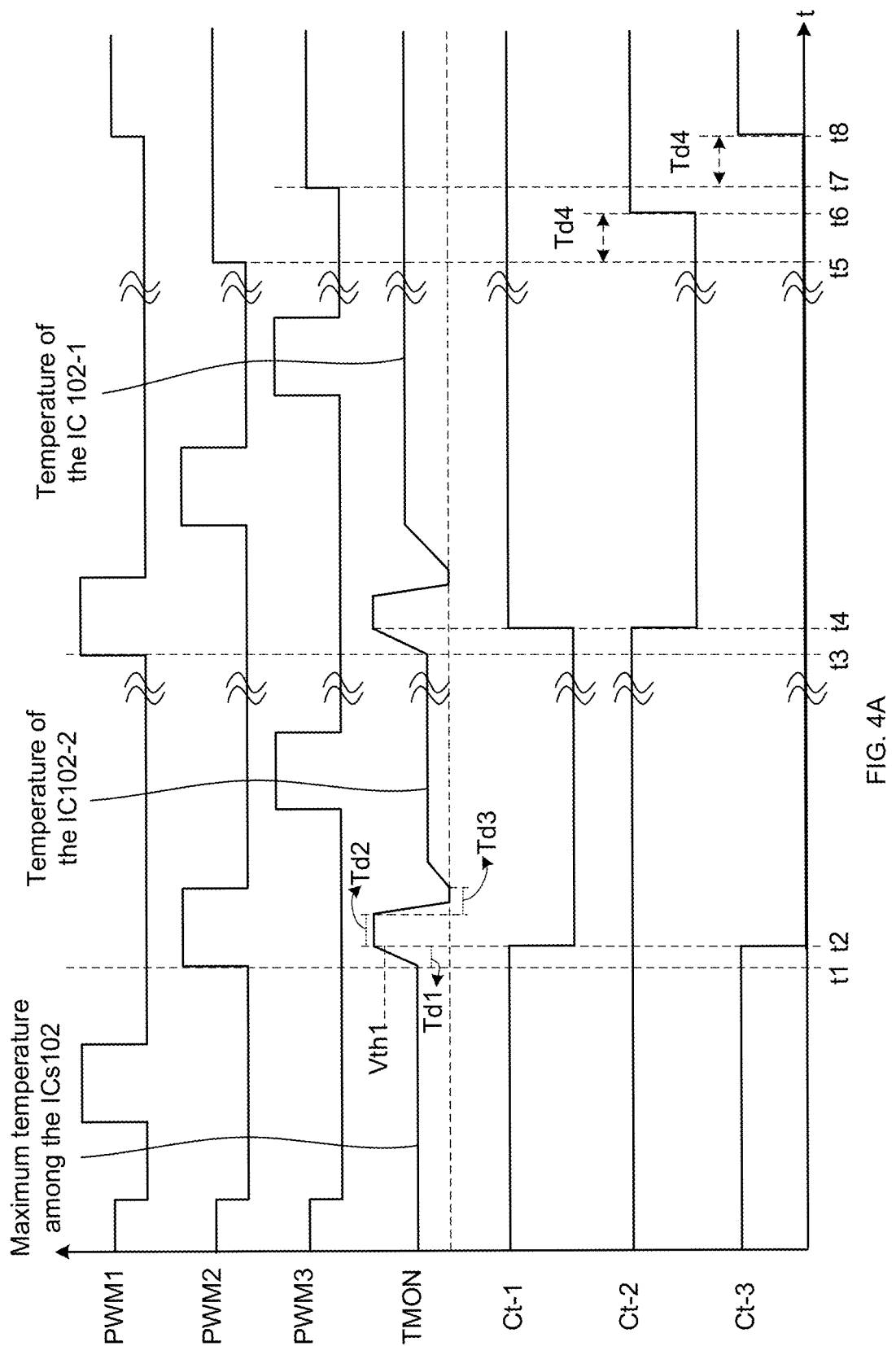
FIG. 4A shows a timing diagram of signals of the multi-phase voltage converter 100 in accordance with an embodiment of the present invention.

FIG. 4A shows a timing diagram of signals of the multi-phase voltage converter 100 in accordance with an embodiment of the present invention. FIG. 4A shows, from top to bottom, the control signal PWM1, the control signal PWM2, the control signal PWM3, the monitoring signal TMON, the switching control signal Ct-1 for the switch 12 of the IC 102-1, the switching control signal Ct-2 for the switch 12 of the IC 102-2, and the switching control signal Ct-3 for the switch 12 of the IC 102-3.

In one example, after the multi-phase voltage converter 100 is enable, the temperature sensing circuit 11 of each IC 102 is connected to the monitoring pin TMON to provide the temperature signal Tsen by default, and the monitoring signal TMON represents a maximum temperature among all of the ICs 102. As shown in FIG. 4A, before time t1, the switch 12 of the IC 102-1 is turn ON by the switching control signal Ct-1, the switch 12 of the IC 102-2 is turned ON by the switching control signal Ct-2, and the switch 12 of the IC 102-3 is turned ON by the switching control signal Ct-3, thus the monitoring signal TMON represents the maximum temperature among all of the ICs 102. At time t1, the controller 101 needs to acquire the individual temperature of the IC 102-2, and the controller 101 pulls up the monitoring signal TMON to be higher than the threshold Vth1 when the control signal PWM2 becomes logic high. At time t2, the monitoring signal TMON is larger than the threshold Vth1, the switch 12 of the IC 102-1 is turned OFF by the switching control signal Ct-1, the switch 12 of the IC 102-3 is turned OFF by the switching control signal Ct-3, and the switch 12 of the IC 102-2 maintains ON. As shown in FIG. 4A, the monitoring signal TMON increases to be larger than the threshold Vth1 by a time period Td1, and maintains its value for a time period Td2. At the end of the time period Td2, the controller 101 pulls down the monitoring signal TMON (e.g., to 0V) for a time period Td3 to reset the monitoring signal TMON. After the pulling up and pulling down operation, the monitoring signal TMON represents the individual temperature of IC 102-2, the controller 101 samples the monitoring signal TMON, and records the sampled monitoring signal TMON as the temperature signal T-phase2 in the register. Similarly, at time t3, the controller needs to acquire the individual temperature of the IC 102-1, and the controller 101 pulls up the monitoring signal TMON when the control signal PWM1 becomes logic high. At time t4, the switch 12 of the IC 102-1 is turned ON by the switching control signal Ct-1, the switch 12 of the IC 102-2 is turned OFF by the switching control signal Ct-2, and the switch 12 of the IC 102-3 maintains OFF. Then the controller 101 pulls down the monitoring signal TMON to reset the monitoring signal TMON. After the pulling up and pulling down operation, the monitoring signal TMON represents the individual temperature of IC 102-1, the controller 101 samples the monitoring signal TMON, and records the sampled monitoring signal TMON as the temperature signal T-phase1 in the register. At time t5, the control signal PWM2 becomes tristate. At time t6, after a delay time period Td4, the switch 12 of the IC 102-2 is turned ON by the switching control signal Ct-2. At time t7, the control signal PWM3 becomes tristate. At time t8, after the delay time period Td4, the switch 12 of the IC 102-3 is turned ON by the switching control signal Ct-3.

Figure 4B:
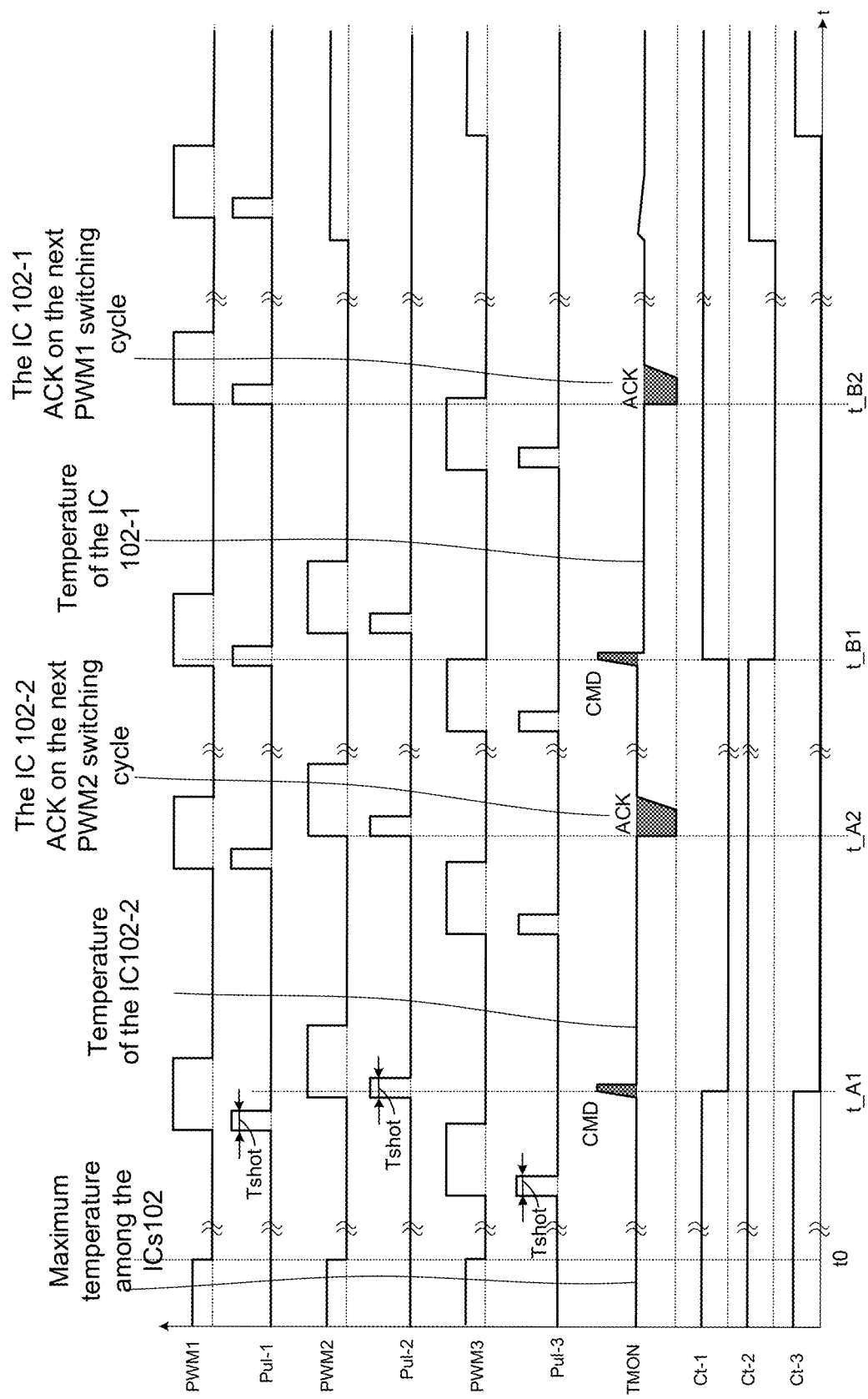
FIG. 4B shows a timing diagram of signals of the multi-phase voltage converter 100 in accordance with another embodiment of the present invention FIG. 5 schematically illustrates a multi-phase voltage converter diagram 500 in accordance with an embodiment of the present invention.

FIG. 4B shows a timing diagram of signals of the multi-phase voltage converter 100 in accordance with another embodiment of the present invention. FIG. 4B shows, from top to bottom, the control signal PWM1, the one shot pulse Pul-1 of the IC 102-1, the control signal PWM2, the one shot pulse Pul-2 of the IC 102-2, the control signal PWM3, the one shot pulse Pul-3 of the IC 102-3, the monitoring signal TMON, the switching control signal Ct-1 for the switch 12 of the IC 102-1, the switching control signal Ct-2 for the switch 12 of the IC 102-2, and the switching control signal Ct-3 for the switch 12 of the IC 102-3.

As shown in FIG. 4B, before time t0, the monitoring signal TMON represents the maximum temperature among all of the ICs 102. At time t_A1, the monitoring signal TMON is pulled up by the command CMD, the one shot pulse Pul-1 is at logic low, the one shot pulse Pul-2 is at logic high, and the one shot pulse Pul-3 is at logic low, thus the switching control signal Ct-1 becomes logic low to turn off the switch 12 of the IC 102-1, the switching control signal Ct-2 maintains logic high to maintain the switch 12 of the IC 102-2 on, and the switching control signal Ct-3 becomes logic low to turn off the switch 12 of the IC 102-3. The temperature sensing circuit 11 of the IC 102-2 maintains to be connected to the monitoring pin TMON, and temperature sensing circuit 11 of the IC 102-1 and temperature sensing circuit 11 of the IC 102-2 are disconnected from the monitoring pin TMON respectively, thus the monitoring signal TMON represents the temperature of the IC 102-2. At time t_A2, on the next PWM2 switching cycle, the IC 102-2 acknowledges the command CMD, and provides the ACK by pulling down the monitoring signal TMON a certain time period. Similarly, at time t_B1, the monitoring signal TMON is pulled up by the command CMD, the one shot pulse Pul-1 is at logic high, the one shot pulse Pul-2 is at logic low, and the one shot pulse Pul-3 is at logic low, thus the switching control signal Ct-1 becomes logic high to turn on the switch 12 of the IC 102-1, the switching control signal Ct-2 becomes logic low to turn off the switch 12 of the IC 102-2, and the switching control signal Ct-3 maintains logic low to maintain the switch 12 of the IC 102-3 off. The temperature sensing circuit 11 of the IC 102-1 is connected to the monitoring pin TMON, and temperature sensing circuit 11 of the IC 102-2 and temperature sensing circuit 11 of the IC 102-3 are disconnected from the monitoring pin TMON respectively, thus the monitoring signal TMON represents the temperature of the IC 102-1. At time t_B2, on the next PWM1 switching cycle, the IC 102-1 acknowledges the command CMD, and provides the ACK by pulling down the monitoring signal TMON for the certain time period.

Figure 5:
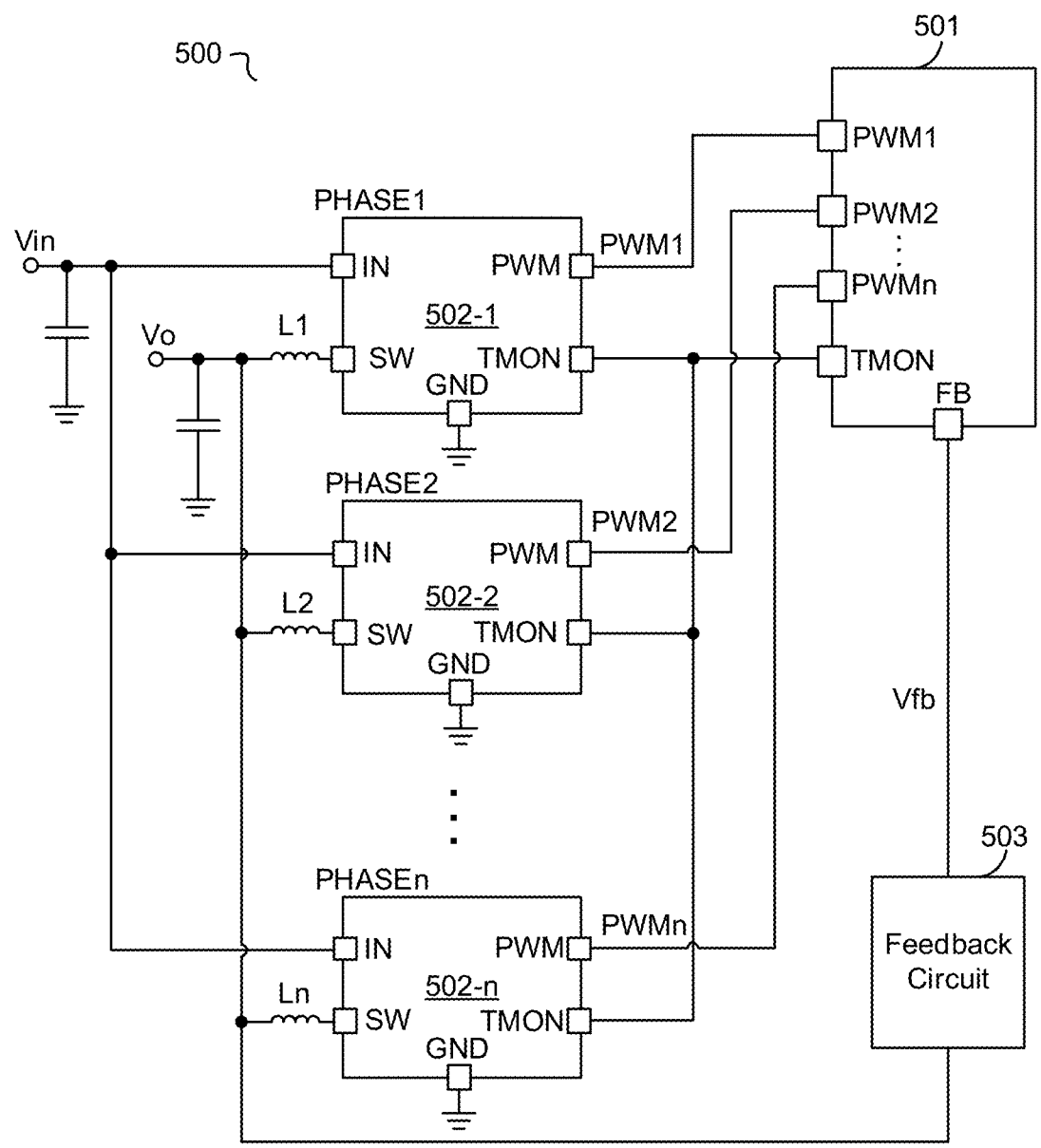

FIG. 5 schematically illustrates a multi-phase voltage converter diagram 500 in accordance with an embodiment of the present invention. In the example of FIG. 5, the multi-phase voltage converter 500 comprises a plurality of ICs 502 (i.e., 502-1, 502-2 . . . 502-n), and a controller 501, where n is an integer larger than one.

In the example of FIG. 5, the plurality of ICs 502 are configured to form a multi-phase switching circuit, and each IC 502 provides a phase of the multi-phase converter 500. As show in FIG. 5, each IC 502 comprises the control pin PWM to receive a control signal PWM, the monitoring pin TMON, a pin IN, a pin SW, and a pin GND. The pins IN of all of the ICs 502 are coupled together to receive an input voltage Vin, and the pin SW of each IC 502 is coupled to one terminal of an inductor Lx (i.e., L1, L2 . . . Ln) respectively, and another terminal of the inductor Lx is coupled to rest of the inductors L1, L . . . Ln together to provide the output voltage Vo. The pin GND is coupled to a reference ground. In the example of FIG. 5, the controller 501 has a plurality of control pins PWM1-PWMn configured to provide a plurality of control signals PWM1-PWMn respectively, a monitoring pin TMON coupled to the monitoring pin TMON of each IC 502, and a feedback pin FB configured to receive the feedback signal Vfb. In one example, the multi-phase voltage converter 500 comprises a feedback circuit 503. The feedback circuit 503 is configured to provide the feedback signal Vfb based on the output voltage Vo.

Figure 6:
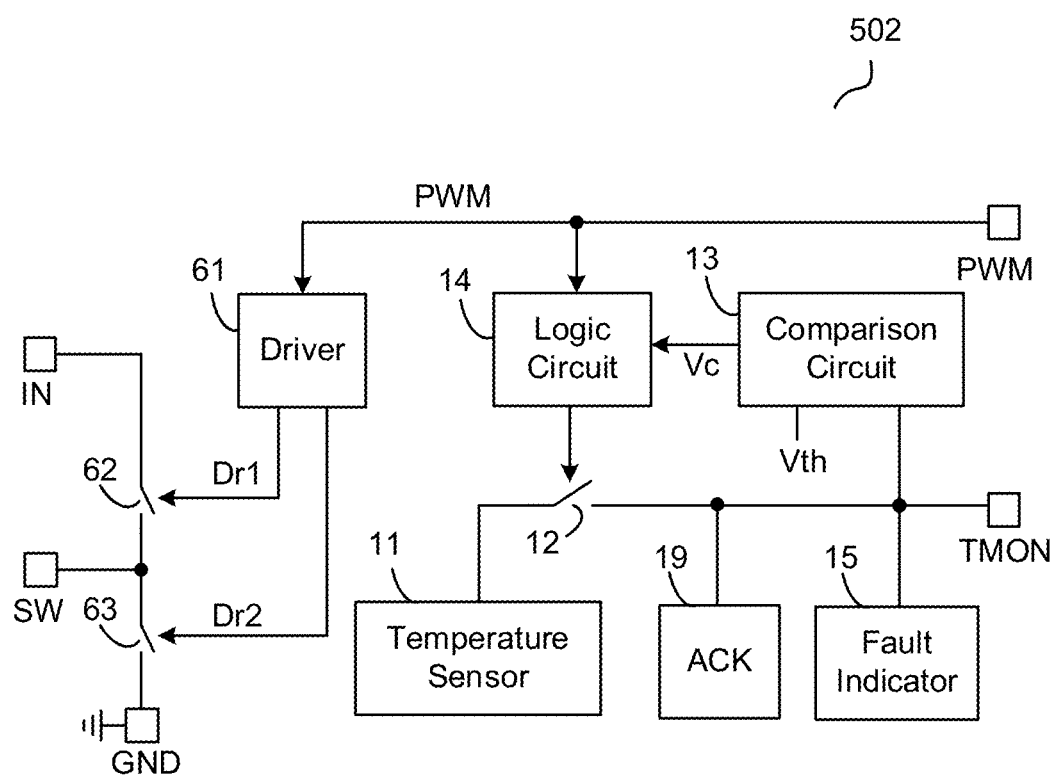
FIG. 6 schematically illustrates the IC 502 of the multi-phase voltage converter 500 shown in FIG. 5 in accordance with an embodiment of the present invention.

FIG. 6 schematically illustrates the IC 502 of the multi-phase voltage converter 500 shown in FIG. 5 in accordance with an embodiment of the present invention. FIG. 6 shows one example of the IC 502, one with ordinary skill in the art should understand that the detailed circuit structure of the IC 502 is not limited by the example shown in FIG. 6.

Compared with the IC 102, the IC 502 further comprises a driver 61, a high-side switch 62, and a low-side switch 63. The driver 61 is coupled to the control pin PWM to receive the control signal PWM, and is configured to provide a drive signal Dr1 and a drive signal Dr2 based on the control signal PWM. The high-side switch 62 has a first terminal coupled to the pin IN to receive the input voltage Vin, a second terminal coupled to the pin SW, and a control terminal coupled to the driver 61 to receive the drive signal Dr1. The high-side switch 62 is configured to be turned ON and OFF by the drive signal Dr1. The low-side switch 63 has a first terminal coupled to the second terminal of the high-side switch 62, a second terminal coupled to the pin GND, and a control terminal coupled to the driver 61 to receive the drive signal Dr2. The low-side switch 62 is configured to be turned ON and OFF by the drive signal Dr2. In one example, the high-side switch 62 and the low-side switch 63 are turned ON and OFF to convert the input voltage Vin to the output voltage Vo based on the control signal PWM. In one example, the high-side switch 62 and the low-side switch 63 may be transistors, such as a MOSFET (Metal Oxide Semiconductor Field Effect Transistor), JFET (Junction Field Effect Transistor), VFET (Vertical Channel Field Effect Transistor) and so on.

Figure 7:
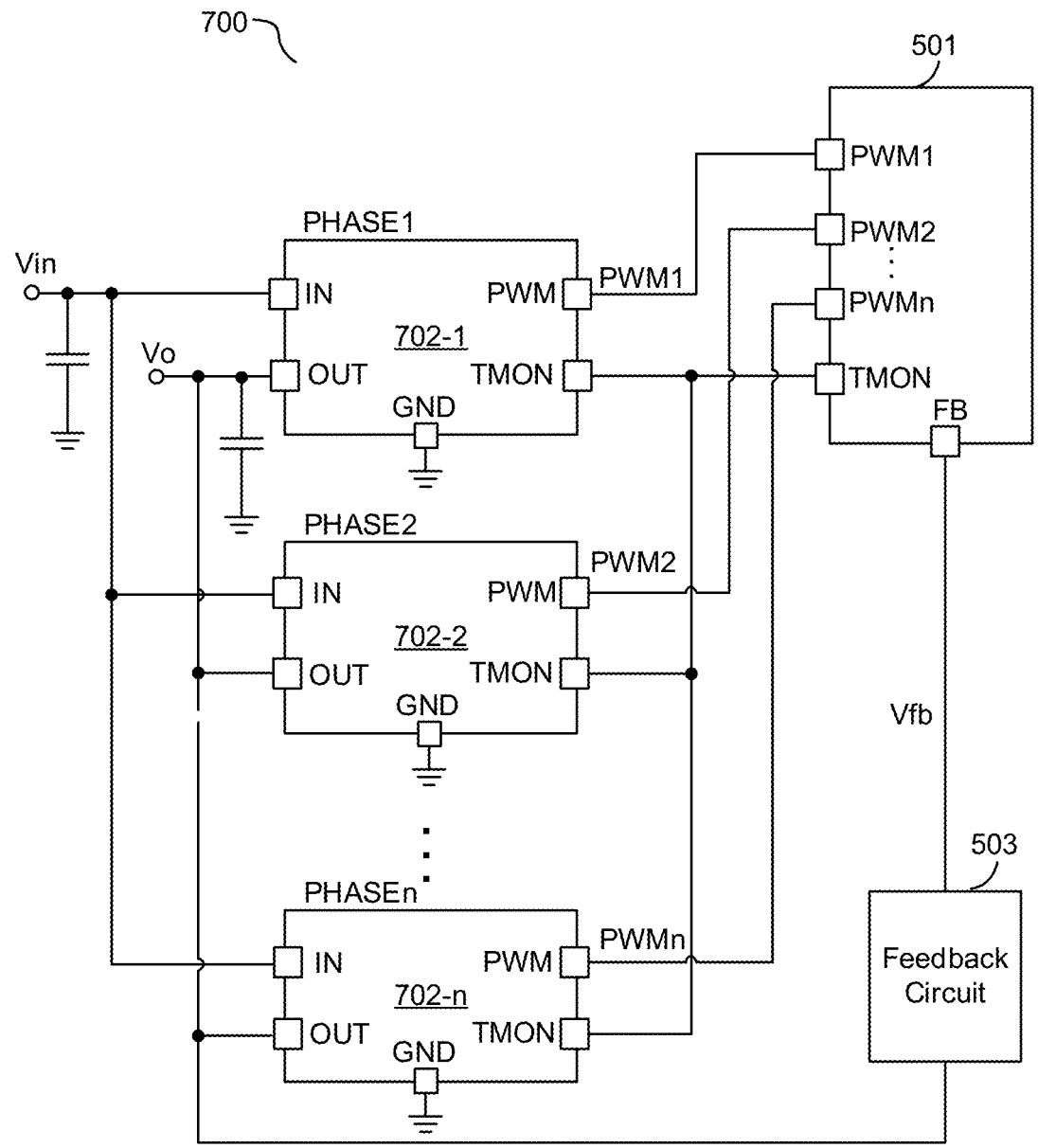
FIG. 7 schematically illustrates a multi-phase voltage converter diagram 700 in accordance with an embodiment of the present invention.

FIG. 7 schematically illustrates a multi-phase voltage converter diagram 700 in accordance with an embodiment of the present invention. In the example of FIG. 7, the multi-phase voltage converter 700 comprises a plurality of ICs 702 (i.e., 702-1, 702-2 . . . 702-n), and a controller 601, where n is an integer larger than one. In the example of FIG. 7, the plurality of ICs 702 are configured to form a multi-phase switching circuit, and each IC 702 provides a phase of the multi-phase converter 700. As show in FIG. 7, each IC 702 comprises the control pin PWM to receive the control signal PWM, the monitoring pin TMON, the pin IN, a pin OUT, and a pin GND. The pin IN of all of the ICs 702 are coupled together to receive the input voltage Vin, and the pin OUT of all of the ICs 702 are coupled together to provide the output voltage Vo. The pin GND is coupled to the reference ground.

Figure 8:
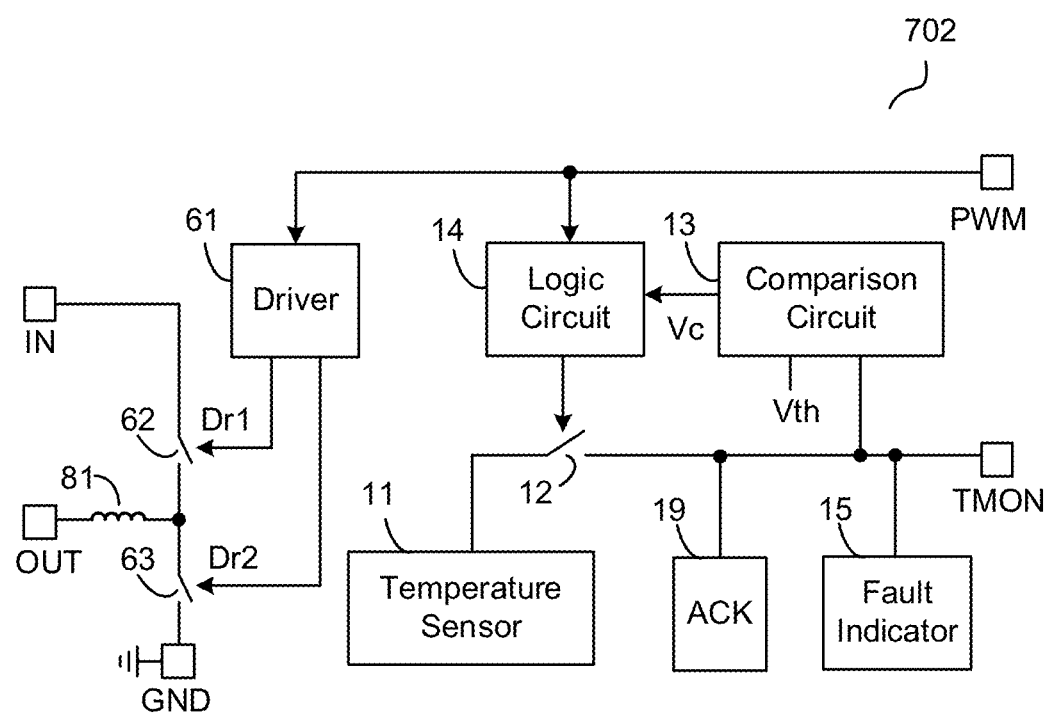
FIG. 8 schematically illustrates the IC 702 of the multi-phase voltage converter 700 shown in FIG. 7 in accordance with an embodiment of the present invention.

FIG. 8 schematically illustrates the IC 702 of the multi-phase voltage converter 700 shown in FIG. 7 in accordance with an embodiment of the present invention. FIG. 8 shows one example of the IC 702, one with ordinary skill in the art should understand that the detailed circuit structure of the IC 702 is not limited by the example shown in FIG. 8.

Compared with the IC 502, the IC 702 further comprises an inductor 81. The first terminal of the high-side switch 62 is coupled to the pin IN to receive the input voltage Vin, the second terminal of the high-side switch 62 is coupled to one terminal of the inductor 81, and a control terminal of the high-side switch is coupled to the driver 61 to receive the drive signal Dr1. Another terminal of the inductor 81 is coupled to the pin OUT. The first terminal of the low-side switch 63 is coupled to the second terminal of the high-side switch 62, the second terminal of the low-side switch 63 is coupled to the pin GND, and the control terminal of the low-side switch 63 is coupled to the driver 61 to receive the drive signal Dr2.

Figure 9:
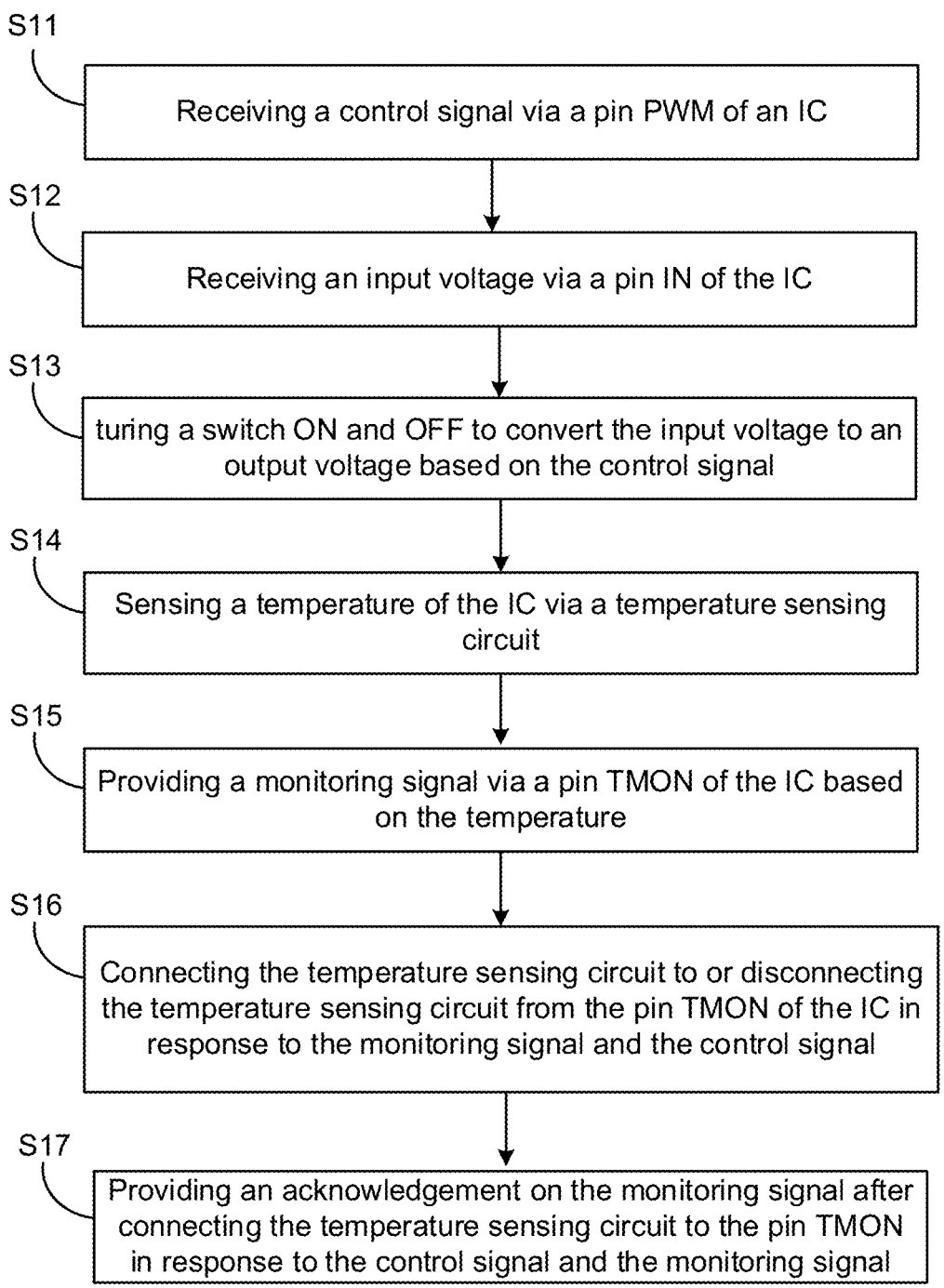
FIG. 9 illustrates a temperature reporting method 900 for a multi-phase converter in accordance with an embodiment of the present invention.

FIG. 9 illustrates a temperature reporting method 900 for a multi-phase converter in accordance with an embodiment of the present invention. The temperature reporting method 900 comprises steps S11-S17.

At step S11, receiving a control signal via a pin PWM of an IC.

At step S12, receiving an input voltage via a pin IN of the IC.

At step S13, turning a switch ON and OFF to convert the input voltage to an output voltage based on the control signal.

At step S14, sensing a temperature of the IC via a temperature sensing circuit.

At step S15, providing a monitoring signal via a pin TMON of the IC based on the temperature.

At step S16, connecting the temperature sensing circuit to or disconnecting the temperature sensing circuit from the pin TMON of the IC in response to the monitoring signal and the control signal. In one embodiment, when the monitoring signal is forced by a command to be higher than a threshold, the temperature sensing circuit is configured to be connected or be disconnected from the second pin in response to the control signal.

At step S17, providing an acknowledgement on the monitoring signal after connecting the temperature sensing circuit to the pin TMON in response to the control signal and the monitoring signal.

In one embodiment, the temperature reporting method further comprises connecting the temperature sensing circuit to the pin TMON when the control signal is in a tristate region, regardless of the monitoring signal.

Note that in the flowchart described above, the functions indicated in the boxes can also occur in a different order than those shown in the figure. Fox example, two boxes presented one after another can actually be executed essentially at the same time, or sometimes in reverse order, depending on the specific functionality involved.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What we claim is:

1. A multi-phase voltage converter, comprising:
   a plurality of integrated circuits (ICs) that each provides a phase of the multi-phase voltage converter, each of the plurality of ICs comprising a control pin, a monitoring pin, and a temperature sensing circuit that is configured to sense an individual temperature of a corresponding one of the plurality of ICs; and
   a controller, comprising a plurality of control pins and a monitoring pin, each of the plurality of control pins of the controller is coupled to the control pin of the corresponding one of the plurality of ICs to provide a control signal, the monitoring pin of the controller is coupled to the monitoring pin of each of the plurality of ICs to receive a monitoring signal; wherein
   the temperature sensing circuit is configured to be connected to or disconnected from the monitoring pin of the corresponding one of the plurality of ICs in response to the control signal and the monitoring signal.

2. The multi-phase voltage converter of claim 1, wherein when a command is provided by the controller to force the monitoring signal to be at a first condition, the temperature sensing circuit is configured to be connected to or disconnected from the monitoring pin of the corresponding one of the plurality of ICs in response to the control signal.

3. The multi-phase voltage converter of claim 2, wherein each of the plurality of ICs further comprises:
   an acknowledgement circuit, coupled to the monitoring pin of the corresponding one of the plurality of ICs to provide an acknowledgement to confirm that the corresponding one of the plurality of ICs has received and responded to the command.

4. The multi-phase voltage converter of claim 3, wherein force the monitoring signal to be at the first condition comprises pulling up the monitoring signal to be higher than a threshold for a time period.

5. The multi-phase voltage converter of claim 1, wherein each of the plurality of ICs further comprises:
   a switch, configured to connect the temperature sensing circuit to the monitoring pin of the corresponding one of the plurality of ICs when the switch is turned ON.

6. The multi-phase voltage converter of claim 5, wherein each of the plurality of ICs further comprises:
a comparison circuit, configured to receive the monitoring signal, and configured to provide a comparison signal via comparing the monitoring signal with a threshold; and
a logic circuit, configured to receive the comparison signal and the control signal, and configured to provide a switching control signal based on the control signal and the comparison signal to control the switch.

7. The multi-phase voltage converter of claim 1, wherein each of the plurality of ICs further comprises:
a fault indicator, configured to pull up the monitoring signal to a voltage source when a fault is occurred.

8. An integrated circuit (IC), comprising:
a first pin, configured to receive a control signal;
a second pin, coupled to a plurality of ICs that are connected together to provide a monitoring signal;
a third pin, configured to receive an input voltage;
a fourth pin, configured as a reference ground;
a temperature sensing circuit, configured to sense a temperature of the IC;
a high-side switch, having a first terminal and a second terminal, the first terminal of the high-side switch is coupled to the third pin to receive the input voltage; and
a low-side switch, having a first terminal and a second terminal, the first terminal of the low-side switch is coupled to the second terminal of the high-side switch, and the second terminal of the low-side switch is coupled to the fourth pin; wherein
the high-side switch and the low side switch are turned ON and OFF respectively based on the control signal; and wherein
the temperature sensing circuit is configured to be connected to or be disconnected from the second pin based on the monitoring signal and the control signal.

9. The IC of claim 8, further comprising:
a first switch, configured to connect the temperature sensing circuit to the second pin when the first switch is turned ON;
a comparison circuit, configured to receive the monitoring signal, and configured to provide a comparison signal via comparing the monitoring signal with a threshold; and
a logic circuit, configured to receive the comparison signal and the control signal, and configured to provide a switching control signal based on the control signal and the comparison signal to control the first switch.

10. The IC of claim 9, wherein the logic circuit further comprising:
a flip-flop, comprising a clock input terminal, a data input terminal, and an output terminal, wherein the clock input terminal is coupled to the comparison circuit to receive the comparison signal, the data input terminal is coupled to the first pin, and the output terminal is configured to provide a first logic signal to control the first switch based on the comparison signal and the control signal.

11. The IC of claim 8, wherein when the control signal is in a tristate region, the temperature sensing circuit is configured to be connected to the second pin to provide the temperature of the IC.

12. The IC of claim 8, wherein when the monitoring signal is forced to be at a first condition, the temperature sensing circuit is configured to be connected to or disconnected from the second pin in response to the control signal.

13. The IC of claim 12, further comprising:
an acknowledgement circuit, coupled to the second pin to provide an acknowledgement to confirm that the IC has responded to the first condition of the monitoring signal.

14. The IC of claim 12, wherein the monitoring signal is forced to be at the first condition comprises the monitoring signal is forced to be higher than a threshold.

15. A temperature reporting method, comprising:
receiving a control signal via a first pin of an integrated circuit (IC);
sensing a temperature of the IC via a temperature sensing circuit;
providing a monitoring signal via a second pin of the IC based on the temperature;
receiving an input voltage via a third pin of the IC;
turning a power switch ON and OFF to convert the input voltage to an output voltage based on the control signal; and
connecting the temperature sensing circuit to or disconnecting the temperature sensing circuit from the second pin of the IC in response to the monitoring signal and the control signal.

16. The temperature reporting method of claim 15, wherein:
wherein when the monitoring signal is forced by a command to be higher than a threshold, the temperature sensing circuit is configured to be connected to or disconnected from the second pin in response to the control signal.

17. The temperature reporting method of claim 15, further comprising connecting the temperature sensing circuit to the second pin when the control signal is in a tristate region.

18. The temperature reporting method of claim 15, further comprising:
providing an acknowledgement on the monitoring signal after connecting the temperature sensing circuit to the second pin in response to the control signal and the monitoring signal.

19. A controller for a multi-phase voltage converter, comprising:
a plurality of control pins, configured to provide a plurality of control signals to a plurality of integrated circuits (ICs) respectively, each of the plurality of ICs provides a phase of the multi-phase voltage converter;
a monitoring pin, connected to each of the plurality of ICs to receive a monitoring signal; and
a control loop, configured to provide the plurality of control signals based on an output voltage of the multi-phase voltage converter and the monitoring signal; wherein
when the controller is configured to acquire an individual temperature of a desired one of the plurality of ICs, and if a corresponding control signal provided to the desired one of the plurality of ICs transits to a first status, the controller is configured to provide a command through the monitoring pin to the plurality of ICs.

20. The controller of claim 19, wherein after a first time period that the command is provided or when an acknowledgement is received through the monitoring pin, the controller is configured to sample the monitoring signal and then record the sampled monitoring signal to a register as the individual temperature of the desired one of the plurality of ICs.

* * * * *